United States Patent [19]

Hofmann

[11] Patent Number: 4,642,574
[45] Date of Patent: Feb. 10, 1987

[54] DIGITAL QUARTZ-STABILIZED FM DISCRIMINATOR

[75] Inventor: Ludwig Hofmann, Lohhof, Fed. Rep. of Germany

[73] Assignee: Siemens Aktiengesellschaft, Munich and Berlin, Fed. Rep. of Germany

[21] Appl. No.: 790,211

[22] Filed: Oct. 22, 1985

[51] Int. Cl.$^4$ ........................ H03D 3/02; H03D 13/00
[52] U.S. Cl. ...................................... 329/50; 307/525;
328/133; 329/122; 329/126; 375/81; 375/120;
455/214
[58] Field of Search ................ 329/50, 104, 107, 110,
329/122, 126; 375/81, 94, 120, 80, 88; 455/214;
307/525, 526; 328/133, 134

[56] References Cited

U.S. PATENT DOCUMENTS

| | | |
|---|---|---|
| 3,983,498 | 9/1976 | Malek .............................. 328/134 X |
| 4,097,812 | 6/1978 | Rzeszewski ..................... 329/107 X |
| 4,345,211 | 8/1982 | Longworth ........................... 329/50 |
| 4,373,204 | 2/1983 | Brooks ................................. 375/120 |

*Primary Examiner*—Siegfried H. Grimm
*Attorney, Agent, or Firm*—Hill, Van Santen, Steadman & Simpson

[57] ABSTRACT

A digital quartz stabilized FM discriminator which is linear and temperature independent and frequency stable and includes a circuit having a phase comparator which receives an input signal and an input from a reversible divider (3) which produces the angular frequencies $f_u$ and $f_o$ of the discriminator. The reversible divider divides a quartz stabilized reference frequency signal under control of the output signal from the phase comparator. A discriminator output signal is obtained by passing the output signal of the phase comparator through a low pass filter.

1 Claim, 1 Drawing Figure

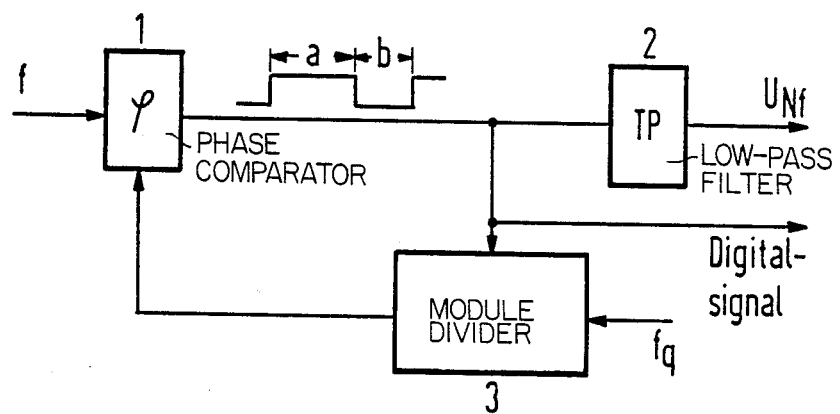

DIGITAL QUARTZ-STABILIZED FM DISCRIMINATOR

BACKGROUND OF THE INVENTION

1. Field of the Invention

This invention relates in general to digital quartz stabilized FM discriminators.

2. Description of the Prior Art

PLL (phase locked loop) demodulators which normally regulate a VCO (voltage controlled oscillator) with a low pass filter in a manner such that the VCO frequency is equal to the input frequency where the regulating voltage is connected to the VCO corresponds to the LF voltage have the disadvantage that due to their temperature and voltage dependency the VCOs are difficult to stabilize. This requires that the VCO be adjusted. The curve of the VCO corresponds to the demodulator curve which means that nonlinearities produce a distortion factor.

When the VCO is operated without a low pass filter, a digital on/off regulator is obtained, the VCO produces only two frequencies which correspond to the lowest and highest demodulatable frequencies. The pulse duty factor corresponds to the ratio of the input frequency to the two possible VCO frequencies.

SUMMARY OF THE INVENTION

It is an object of the present invention to provide a FM discriminator which as much as possible is linear, temperature independent and frequency stable.

This object is accomplished for an FM discriminator according to the invention by using a reversible divider which is arranged in the PLL loop (phase locked loop) in the input signal circuit and which produces angular frequencies $f_u$ and $f_o$ of the discriminator and by using a low pass filter which is arranged in the transmission path following the connection point of the PLL loop.

In an advantageous development of the invention it is provided that the frequency of the input signal is controlled by the equation: $f_{Ein} = a \cdot f_o + b \cdot f_u$, where $a+b=1$ and a and b indicate the pulse duty factor of the control signal.

Other objects, features and advantages of the invention will be readily apparent from the following description of certain preferred embodiments thereof taken in conjunction with the accompanying drawings although variations and modifications may be effected without departing from the spirit and scope of the novel concepts of the disclosure and in which:

BRIEF DESCRIPTION OF THE DRAWINGS

The FIGURE comprises a block diagram of the FM discriminator of the invention.

DESCRIPTION OF THE PREFERRED EMBODIMENTS

An input signal which has a frequency of $f_{Ein}$ is supplied to a phase comparator 1. The phase comparator has its output connected to a low pass filter 2 which produces an output voltage $U_{Nf}$ (low frequency signal). A PLL loop is connected from the signal path between the phase comparator 1 and the low pass filter 2 to a second input of the phase comparator 1. The PLL loop contains a reversible modulo-divider 3 which is a switcheable frequency divider and is sometimes identified as a modulo scaler which receives an input from the connection point between the phase comparator 1 and the low pass filter 2 and supplies an output to the phase comparator 1 as illustrated. The reversible modulo divider 3 receives a quartz stabilized frequency $f_q$ from a suitable crystal not illustrated. The reversible modulo divider 3 produces two angular frequencies in its output $f_u$ and $f_o$ of the FM discriminator.

In the invention, $f_{Ein} = a \cdot f_o + b \cdot f_u$, where $a+b=1$, and a and b indicate the pulse duty factor of the control signal as illustrated in wave form shape to the right of the phase comparator 1 in the FIGURE.

When the control signal is fed through the low pass filter 2, the low frequency signal ($U_{Nf}$) appears at the output of the filter 2. The frequencies $f_o$ and $f_u$ produced by the modulo divider 3 depend only upon the frequency of the quartz $f_q$ and, thus, are quartz stabilized. Thus, no adjustment of the circuit is necessary or is required.

Since a pulse duty factor occurs in the low pass filter 2, the pulse duty factor can be counted and digitized at this position which is a substantial advantage. Thus, a digital signal can be removed from the connection point between the phase comparator and the low pass filter 2 as illustrated and prior to the modulo divider 3.

It is seen that this invention provides an improved digital quartz stabilized FM discriminator.

Although the invention has been described with respect to preferred embodiments, it is not to be so limited as changes and modifications may be made therein which are within the full intended scope of the invention as defined by the appended claims.

I claim as my invention:

1. A digital crystal-stabilized FM-discriminator comprising a phase-locked loop (PLL) which contains a phase comparator and a switchable frequency divider, whereby an input signal of the discriminator and the output signal of the frequency divider are supplied to the phase comparator and a crystal-stabilized frequency $f_q$ and the output signal of the phase comparator are supplied to the frequency divider, characterized in that a low-pass filter is connected into the signal transmission path at the junction point of the output of the phase comparator and the input of the frequency divider, and the output signal of the phase comparator being supplied to said low-pass filter and a voltage $U_{Nf}$ is supplied from the output of said low pass filter, and said frequency divider generates a signal which contains the corner frequencies $f_u$ and $f_o$ of the discriminator; and the frequency of said input signal is $f_{Ein} = a \cdot f_o + b \cdot f_u$ where $a+b=1$ and a and b indicate the pulse-duty factor of the output signal of the phase comparator.

* * * * *